United States Patent
Lee et al.

(10) Patent No.: US 8,318,268 B2
(45) Date of Patent: Nov. 27, 2012

(54) AA STACKED GRAPHENE-DIAMOND HYBRID MATERIAL BY HIGH TEMPERATURE TREATMENT OF DIAMOND AND THE FABRICATION METHOD THEREOF

(75) Inventors: Jae-Kap Lee, Seoul (KR); So-Hyung Lee, Gyeonggi-Do (KR); Seung-Cheol Lee, Seoul (KR); Jae-Pyoung Ahn, Seoul (KR); Jeon-Kook Lee, Gyeonggi-Do (KR); Wook-Seong Lee, Seoul (KR)

(73) Assignee: Korea Institute of Science and Technology (KR)

( * ) Notice: Subject to any disclaimer, the term of this patent is extended or adjusted under 35 U.S.C. 154(b) by 0 days.

(21) Appl. No.: 13/316,634

(22) Filed: Dec. 12, 2011

(65) Prior Publication Data

US 2012/0082614 A1    Apr. 5, 2012

Related U.S. Application Data

(62) Division of application No. 12/437,838, filed on May 8, 2009.

(30) Foreign Application Priority Data

May 29, 2008  (KR) .................. 10-2008-0050480

(51) Int. Cl.
*C23C 16/00*  (2006.01)
(52) U.S. Cl. ......................................................... 427/577
(58) Field of Classification Search .................. 427/577
See application file for complete search history.

(56) References Cited

U.S. PATENT DOCUMENTS

| | | |
|---|---|---|
| 7,619,257 B2 | 11/2009 | Pfeiffer |
| 7,776,445 B2 | 8/2010 | Lee et al. |
| 7,781,061 B2 | 8/2010 | Garcia et al. |

OTHER PUBLICATIONS

Kurihara et al., "*Expitaxial Growth of Graphite Layer on {111}—Surface of Vapor Deposited Diamond*", J. Appl. Phys. 89 (9) May 1991.

*Primary Examiner* — Archene Turner
(74) *Attorney, Agent, or Firm* — Ostrolenk Faber LLP

(57) ABSTRACT

There is provided a fabrication method for an AA stacked graphene-diamond hybrid material by converting, through a high temperature treatment on diamond, a diamond surface into graphene. According to the present invention, if various types of diamond are maintained at a certain temperature having a stable graphene phase (approximately greater than 1200° C.) in a hydrogen gas atmosphere, two diamond {111} lattice planes are converted into one graphene plate (2:1 conversion), whereby the diamond surface is converted into graphene in a certain thickness, thus to fabricate the AA stacked graphene-diamond hybrid material.

6 Claims, 4 Drawing Sheets

AB STACKED GRAPHITE

AA STACKED GRAPHENE-DIAMOND HYBRID MATERIAL BY HIGH TEMPERATURE TREATMENT OF DIAMOND AND THE FABRICATION METHOD THEREOF

CROSS REFERENCE TO RELATED APPLICATION

This application is a continuation of U.S. application Ser. No. 12/437,838, filed May 8, 2009, by Jae-Kap LEE, et al., entitled AA STACKED GRAPHENE-DIAMOND HYBRID MATERIAL BY HIGH TEMPERATURE TREATMENT OF DIAMOND AND THE FABRICATION METHOD THEREOF which claims the benefit of Korean Appln. S.N. 10-2008-0050480 filed May 29, 2008, the contents of which are incorporated by this reference.

RELATED APPLICATION

The present disclosure relates to subject matter contained in priority Korean Application No. 10-2008-0050480, filed on 29 May 2008, which is herein expressly incorporated by reference in its entirety.

BACKGROUND OF THE INVENTION

1. Field of the Invention

The present invention relates to a high functional carbon material, and more particularly, to an AA stacked graphene-diamond hybrid material by high temperature treatment of diamond and a fabrication method thereof.

2. Background of the Invention

Graphene refers to one sheet of graphite, i.e., the (0001) surface of graphite. If graphene is stacked upon one another in a pattern of AB (or ABC), it becomes generally known graphite (space group #194, p6/mmc; this is referred to as 'AB stacked graphite') (refer to FIG. 1). An interplanar spacing between graphene of the AB stacked graphite is 3.35 Å.

If an element, such as Li, and the like, is intercalated into the AB stacked graphite, a stacked structure of the graphene becomes the AA pattern, thus to be AA stacked graphene (space group #191, p6/mmm; this is referred to as 'AA stacked graphite.') If Li is intercalated, the interplanar spacing thereof becomes 3.706 Å, which increases approximately 10.6% as compared to the AB stacked graphite.

If pure AA stacked graphene without any Li intercalation is to be fabricated, the interplanar spacing of graphene becomes 3.55 Å, which has more independent structural characteristic than the case of the AB stacked graphene. Accordingly, the AA stacked graphene may easily be separated as well as have an excellent electrical characteristic. In addition, since the interplanar spacing of the AA stacked graphene is greater than that of the AB stacked graphene by approximately 5%, it may be used for a material exchange medium (an electrode material for a Li battery) and a Graphite Intercalation Compound (GIC) new substance development by a hetero element intercalation.

However, the AB stacked graphene is more stable than the AA stacked graphene in terms of energy, whereby pure AA stacked graphene does not exist and even its composition is not possible.

SUMMARY OF THE INVENTION

The present invention is to epitaxially form pure AA stacked graphene on diamond.

In addition, the present invention is to provide a method for compounding AA stacked graphene capable of growing in units of the second and having an atomically flatness equivalent to a diamond surface when the AA stacked graphene is to be formed on diamond.

To achieve these and other advantages and in accordance with an aspect of the present invention, there is provided an AA stacked graphene-diamond hybrid material, including: a diamond matrix; and AA stacked graphene configured to be converted in a certain thickness from {111} lattice planes cut by a surface of the diamond matrix due to an alternative loss of the {111} lattice planes.

In addition, there is provided a fabrication method for an AA stacked graphene-diamond hybrid material, wherein a diamond matrix is maintained within a temperature range having a stable graphene phase in a hydrogen gas atmosphere such that a surface of the diamond matrix in a certain thickness is converted into AA stacked graphene due to an alternative loss of {111} lattice planes cut by the surface of the diamond matrix.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

EFFECT OF THE INVENTION

According to the present invention, AA stacked graphene, having the interplanar spacing of 3.5-4.4 Å which is greater than an existing AB stacked graphite (3.35 Å) by 5~30% and having excellent physical properties, may be formed on a diamond matrix with a simple process.

According to the present invention, since there is no need to have a time to generate a nucleus on the diamond matrix (i.e., incubation time), a second unit process is enabled, and the graphene surface may maintain flatness in an atomic level.

The diamond serves as a nonconductor (insulator), and graphene has a characteristic of a semi-conductor or conductor. The AA stacked graphene-diamond hybrid material may be utilized in a next generation semi-conductor device (e.g., graphene-diamond single crystal substrate), an electrode material of a Li battery with enhanced power density (e.g., graphene-diamond powder), and various types of a new material development.

DETAILED DESCRIPTION OF THE INVENTION

Graphene and a diamond {111} lattice plane have a very similar structure. Both has a hexagonal ring structure of carbon atoms [Here, the former has a flat hexagonal ring shape while the latter has a buckled hexagonal ring shape], and lattice constant error is only 2% (For spacing between neighboring atoms, diamond is 1.45 Å and graphene is 1.42 Å).

Accordingly, as an exemplary method for fabricating graphene, a method for "growing" graphene on the diamond {111} lattice plane has been considered. Detailed descriptions regarding such method have already been given by this research team in Korean Patent Application No. 2007-0081989.

The present invention has proposed another method for fabricating graphene, in which diamond is treated under a condition that the graphene phase is stable so as to "convert" {111} lattice plane cut by the diamond surface into graphene. Here, the "cut {111} lattice plane" signifies that the {111} lattice plane existing inside a diamond crystal is cut by the diamond surface, and thusly is different from the diamond surface.

For the conversion, an interplanar spacing of the diamond {111} lattice is 2.06 Å, and an interplanar spacing of the stacked AA graphene (hereinafter, also referred to as 'AA stacked graphene') is approximately 3.55 Å which is the double. Thus, two diamond {111} lattice planes become (are converted into) one graphene. That is, the diamond lattice plane and graphene perform a 2:1 conversion (refer to FIG. 2). Here, atomic hydrogen is coupled onto the diamond is {111} lattice cut by the graphene/diamond interface. Due to the structural characteristic of the diamond {111} lattice plane, if a graphene plate is formed on the diamond {111} lattice plane through 2:1 conversion, the AA stacked graphene is formed. It should be noted that if a graphene plate is formed through 1:1 conversion, AA' stacked graphene may be formed (refer to FIG. 3). However, AB stacked graphite is not presented.

Figure 1:
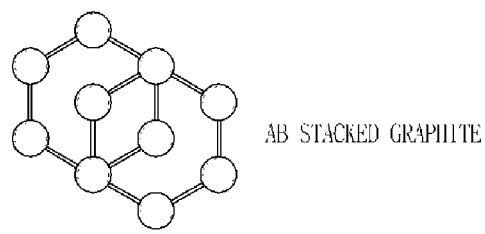
FIG. 1 is a schematic view illustrating a structure of AB stacked graphene (generally known as graphite)
Figure 4:
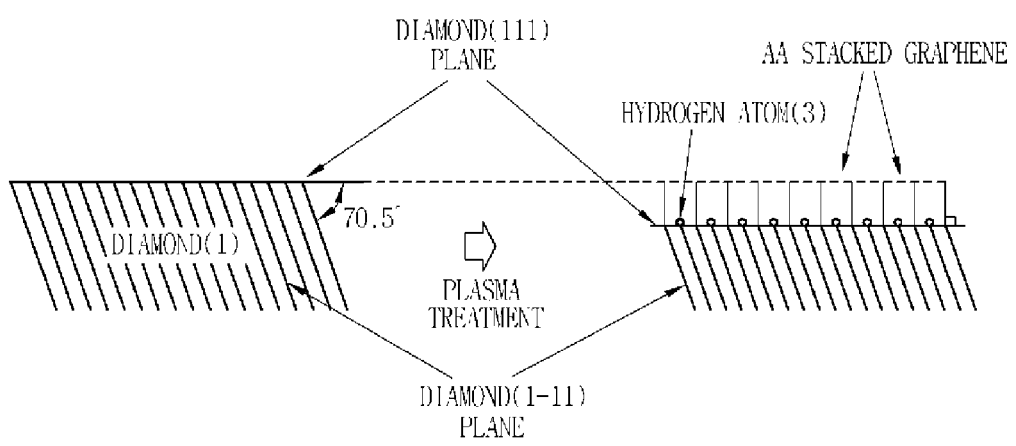
FIG. 4 is an overview schematically illustrating a process of fabricating an AA stacked graphene-diamond hybrid material by using a single crystal diamond (111) substrate according to an exemplary embodiment of the present invention.

The diamond {111} lattice plane within a single diamond crystal consists of 4 planes: (111), (−111), (1−11) and (11−1). (Here, the symbol "−" indicates a minus symbol in the Miller index.) On all diamond surfaces, one or more {111} lattice planes being cut are exposed. Graphene is formed through 2:1 conversion on an extension of the {111} lattice plane cut by the diamond surface, and is formed perpendicularly to any one of the lattice plane of the 4 {111} lattice planes (refer to FIGS. 2, 4, and 5). Since the diamond formed by covalent bond is a directional crystal, a formation angle of graphene varies according to the surface constituting the diamond surface. That is, if the diamond surface is the (111) plane, an angle (formation angle) between the diamond surface and the graphene plate is 90° (refer to FIGS. 1 and 4), and for the (110) plane, a formation angle is 60° (refer to FIG. 5), and for the (100) plane, a formation angle is 30° (not shown).

The concept of 2:1 conversion by a high temperature treatment in the present invention is that the diamond {111} lattice plane cut by the surface is etched to be disappeared. Therefore, the "conversion" of the diamond, differently from the "growth" of the graphene, does not need to have a latent period (several tens of minutes) of a nucleus formation required for "growth," thus to enable a short time process in units of the second, similar to a general etching process. In addition, since the diamond surface is converted, the surface of the formed AA stacked graphene may maintain a flatness which is equivalent to an initial diamond surface (flat atomically).

Hereinafter, description of the preferred embodiment of the present invention will be given in more detail.

The fabrication method for an AA stacked graphene-diamond hybrid material according to the present invention consists of (1) preparing diamond serving as a matrix, and (2) performing a high temperature treatment on the diamond so as to convert a layer having a thickness of several Å~ several μm on a diamond surface into AA stacked graphene.

Preparation of Diamond Matrix

Both a single crystal diamond and a polycrystalline diamond may be used as a matrix, and formed in the shape of powder, a film, a plate or the like. For instance, diamond powder having a size of several nm~1 mm, a single crystal diamond plate having a size of several mm, or a polycrystalline CVD diamond film having a size of approximately several tens cm may be used. Preferably, the diamond powder may be used to obtain a powdered graphene/diamond hybrid material, the single crystal diamond plate for an electron device application, and a polycrystalline CVD diamond film for other substrate material application. If the CVD diamond film is to be used, it is more preferable to use a diamond that is deposited on a silicon wafer in the form of a thin film (thickness ~μm) in terms of an economy.

High Temperature Treatment

The high temperature treatment on the diamond serving as the matrix is performed in the range of a temperature (in general, approximately 1,200~1,800° C.) having a stable graphene phase within a vacuum container capable of maintaining a hydrogen gas atmosphere. The high temperature treatment may be performed using heat, plasma or a laser. If a laser is used to perform the high temperature treatment, there is an advantage that graphene may be locally (e.g., a dot, a line shape) formed on the diamond matrix.

A minimum value of the temperature range having the stable graphene phase may slightly vary according to chemical vapor conditions (e.g., a presence or absence of plasma formation, gas pressure, or the like). The high temperature treatment using heat is performed at an area where a surface temperature of the matrix is in the range of approximately 1,300~1,800° C., and the high temperature treatment using a plasma device may be performed at an area where a surface temperature of the matrix is lowered to approximately 1,200~1,600° C. If a temperature is lower than the minimum value of the temperature range, a conversion from diamond into graphene may be difficult. If a temperature is greater than the maximum value thereof, the entire sample may be converted into the AB stacked graphite. In addition, if the high temperature treatment using a laser is to be performed, a surface temperature of the matrix is room temperature (below several hundreds ° C.), and temperature of an area contacting a laser beam may be greater than 2,000° C. depending on laser power.

Figure 2:
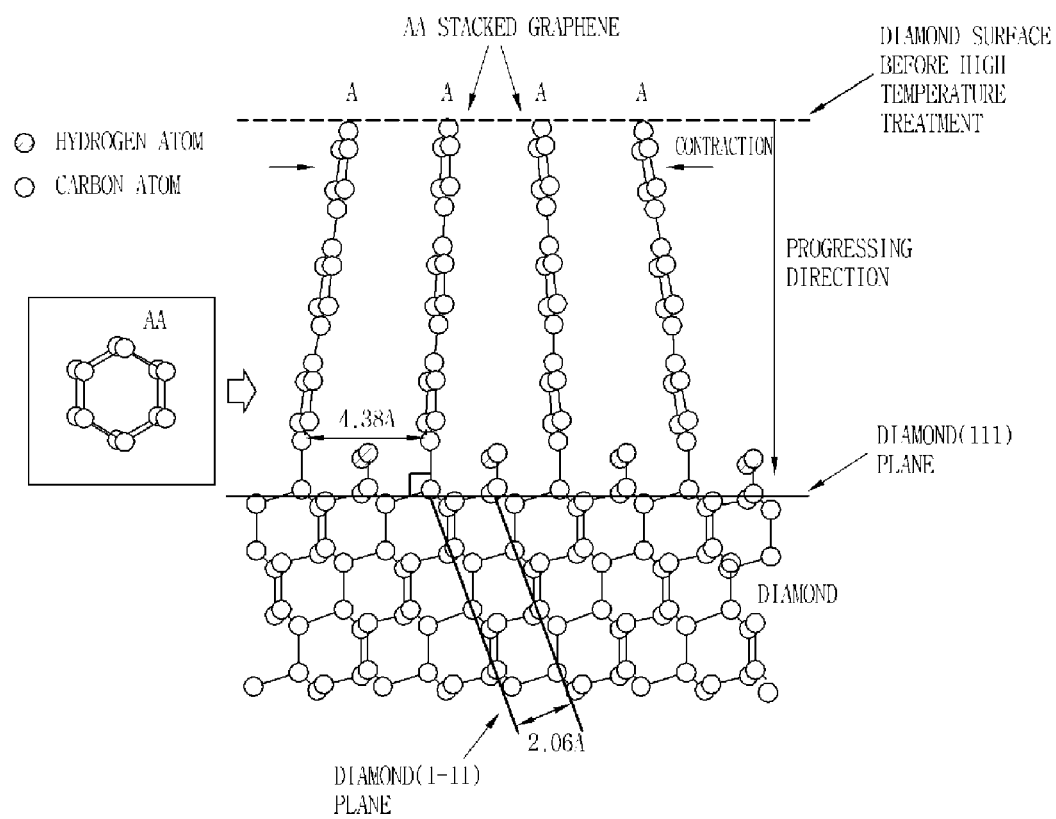
FIG. 2 is a schematic view illustrating a process of forming AA stacked graphene from a diamond surface according to an exemplary embodiment of the present invention (The inset shows a structure of AA stacked graphene)
Figure 3:
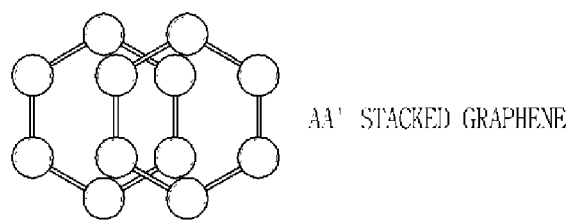
FIG. 3 is a schematic view illustrating a structure of AA' stacked graphene.

After performing such high temperature treatment, as shown in FIG. 2, the diamond {111} lattice planes cut by the surface before performing the high temperature treatment are alternatively lost due to high temperature treatment, thereby being converted into AA stacked graphene (refer to the inset in FIG. 2). Such conversion is progressed from the surface of the diamond matrix toward the inside thereof. Due to a crystal structure of the diamond, an interplanar spacing of the graphene on the graphene/diamond interface is 4.38 Å. As a length of the graphene layer becomes longer, this interplanar spacing is gradually contracted to 3.55 Å considered as an ideal interplanar spacing of the AA stack.

Hereinafter, description of the exemplary embodiment of the present invention will be given. However, this description is intended to be illustrative, and not to limit the scope of the claims. It should also be understood that the above-described embodiments but rather should be construed broadly within its scope as defined in the appended claims.

EXAMPLE 1

Figure 6A:
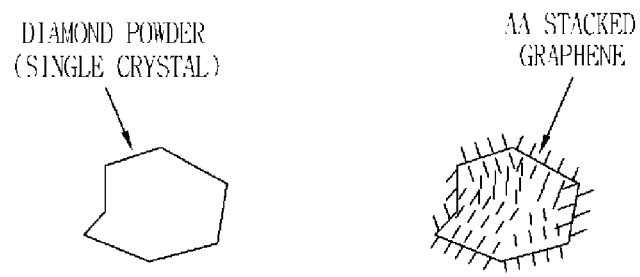
FIGS. 6a through 6c illustrate respective processes of fabricating an AA stacked graphene-diamond hybrid material by respectively using, as a matrix, diamond powder in 6a, a polycrystalline diamond film in 6b, and a single crystal diamond plate in 6c.

AA stacked graphene-diamond hybrid powder was prepared by using diamond powder (size: 1~2 μm) as a matrix (refer to FIG. 6a).

A device used for the high temperature treatment was a multi-cathode direct current power plasma diamond synthesizer. After diamond powder was placed on to a molybdenum substrate, the diamond/substrate set was placed on an anode of the synthesizer for plasma treatment. The conditions of the plasma treatment are as follows: 200 sccm of hydrogen gas, a pressure of 100 Torr, and a molybdenum substrate at a temperature of approximately 1200° C. (Surface temperature of the diamond matrix is expected to be higher than that of the substrate by several tens ° C.). A processing time was 1 minute.

Figure 7:
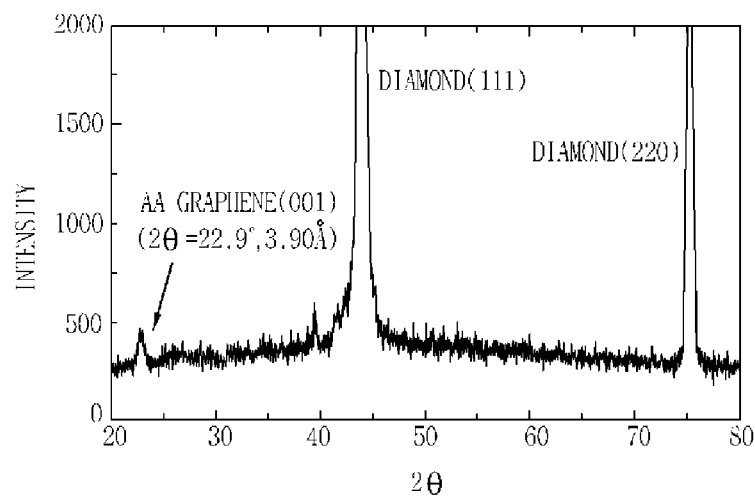
FIG. 7 illustrates an XRD analysis result of a sample treated with plasma according to a first exemplary embodiment of the present invention, showing an epitaxial coupling between AA stacked graphene having an interplanar spacing of approximately 3.90 Å and a diamond substrate.

According to the result of analyzing this sample by X-Ray Diffraction (XRD), as shown in FIG. 7, a (001) peak ($2\theta=22.9°$) of the AA stacked graphene, together with a diamond (111) peak ($2\theta=43.8°$ and a (110) peak ($2\theta=75.4°$ was observed. This indicated epitaxial coupling between the AA stacked graphene having an interplanar spacing of approximately 3.90 Å and the diamond substrate. According to the result of analyzing this sample by High-Resolution Transmission Electron Microscopy (HRTEM), the thickness of the AA graphene layer was several tens nm, which verifies the 2:1 conversion relationship between the diamond {111} lattice plane and the graphene. Therefore, the AA stacked graphene-diamond hybrid powder could be obtained.

EXAMPLE 2

Figure 6B:
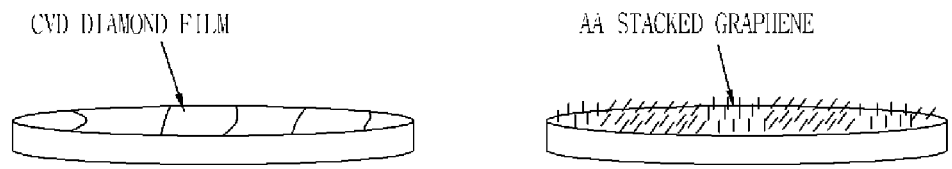

A diamond/silicon plate in which diamond having a thickness of 5 μm was deposited on a silicon substrate having a diameter of 4" and a thickness of 0.5 mm was used as a matrix (refer to FIG. 6b), and was undergone the plasma treatment for 10 seconds under the same condition as Example 1.

According to the result of analyzing the sample treated with the plasma by HRTEM, it could be observed that the thickness of the AA graphene layer was several nm, and the 2:1 conversion relationship between the diamond {111} lattice plane and graphene. Accordingly, the AA stacked graphene-diamond hybrid layer could be obtained on the silicon substrate.

EXAMPLE 3

A polycrystalline CVD diamond film having a ground (abraded, polished) <110> texture ($10\times10\times0.5$ mm$^3$T) was used as a matrix, and was undergone the plasma treatment for 10 minutes under the same condition as Example 1 (here, the substrate temperature was 1250° C.).

Figure 5:
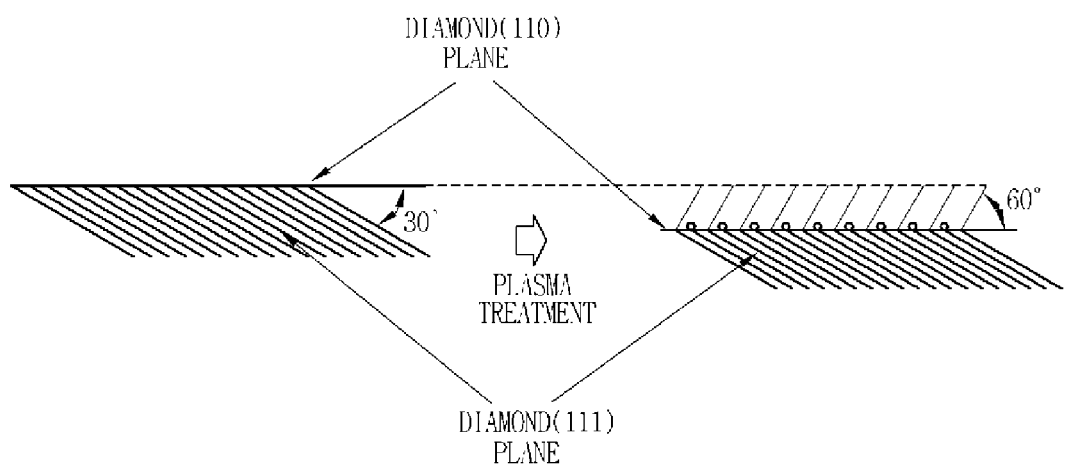
FIG. 5 is an overview schematically illustrating a process of fabricating an AA stacked graphene-diamond hybrid material by using a single crystal diamond (110) substrate according to an exemplary embodiment of the present invention.

According to the result of analyzing the treated sample by HRTEM, it was observed that the thickness of the AA graphene layer was several hundreds nm, and the 2:1 conversion relationship between the diamond {111} lattice plane and graphene. According to the result of analyzing this sample by rocking curve XRD, it was observed that graphene was oriented having an angle of 60° with respect to the diamond surface (i.e., (110) plane). This is identical to the schematic diagram as shown in FIG. 5. Accordingly, it could also be checked that the formation angle of AA stacked graphene was changed on the diamond as the surface constituting the diamond surface is changed.

Meanwhile, due to the structural characteristic of the diamond crystal, if the diamond surface consists of the (100) plane, the formation angle of graphene is 30°.

EXAMPLE 4

Figure 6C:
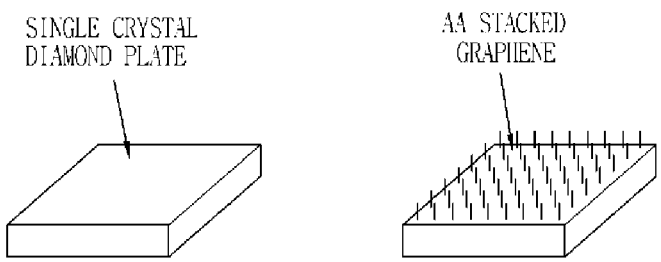

A $5\times5\times1$ mm$^3$T single crystal (110) diamond plate was used as a matrix (refer to FIG. 6c), and was undergone the plasma treatment for 30 seconds under the same condition as Example 1 (here, the substrate temperature was 1300° C.).

According to the result of analyzing the plasma-treated sample by HRTEM, it was observed that the epitaxial coupling between the AA stacked graphene of approximately 1 nm and the diamond surface. Although the temperature in this Example was higher than that in Examples 1 and 2, the length of the graphene layer was shown to be shorter than those in Examples 1 and 2. This may be analyzed that the single crystal had a difficulty of being converted into graphene since the single crystal has few crystal defect.

EXAMPLE 5

A polycrystalline CVD diamond film having a ground <110> texture ($10\times10\times0.5$ mm$^3$T) was used as a matrix, and was undergone the heat treatment for 10 minutes in a hydrogen atmosphere in a vacuum furnace (vacuum furnace without a plasma) at a temperature of approximately 1400° C.

According to the result of analyzing the heat-treated sample by HRTEM, it was observed that the thickness of the AA graphene layer was several nm, and the 2:1 conversion relationship between the diamond {111} lattice plane and graphene. Therefore, the AA stacked graphene-diamond hybrid film was obtained.

EXAMPLE 6

A polycrystalline CVD diamond film having a ground <110> texture ($10\times10\times0.5$ mm$^3$T) was used as a matrix, and was undergone the laser treatment in a hydrogen atmosphere in a vacuum furnace having a laser device therein. The scan rate of a laser beam was maintained at 1 mm/min.

According to the result of analyzing a track (trace) of the laser beam by HRTEM, the AA graphene layer was observed.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present invention may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A fabrication method for an AA stacked graphene-diamond hybrid material, wherein a diamond matrix is maintained within a temperature range having a stable graphene phase in a hydrogen gas atmosphere such that a surface of the diamond matrix in a certain thickness is converted into AA stacked graphene due to an alternative loss of {111} lattice planes cut by the surface of the diamond matrix.

2. The fabrication method of claim 1, wherein the conversion is progressed from the surface of the diamond matrix to an inside thereof.

3. The fabrication method of claim 1, wherein heat, plasma or a laser is used such that the diamond matrix is maintained within a temperature range in which a graphene phase is stable.

4. The fabrication method of claim 3, wherein for the heat treatment, a surface temperature of the diamond matrix is 1,300~1,800° C.

5. The fabrication method of claim 3, wherein for the plasma treatment, a surface temperature of the diamond matrix is 1,200~1,600° C.

6. The fabrication method of claim 3, wherein for the laser treatment, a surface temperature of the diamond matrix is room temperature, and a temperature of an area contacting a laser beam is greater than 2,000° C. depending on laser power.

* * * * *